United States Patent
Ko et al.

(10) Patent No.: US 7,531,841 B2
(45) Date of Patent: May 12, 2009

(54) NITRIDE-BASED SEMICONDUCTOR LIGHT EMITTING DEVICE

(75) Inventors: Kun Yoo Ko, Hwaseong (KR); Bang Won Oh, Seongnam (KR); Hun Joo Hahm, Seongnam (KR); Je Won Kim, Suwon (KR); Hyung Jin Park, Suwon (KR); Seok Min Hwang, Suwon (KR); Dong Woo Kim, Seoul (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 11/651,023

(22) Filed: Jan. 9, 2007

(65) Prior Publication Data

US 2007/0228388 A1     Oct. 4, 2007

(30) Foreign Application Priority Data

Apr. 4, 2006   (KR)  ............ 10-2006-0030502

(51) Int. Cl.
    *H01L 27/15* (2006.01)
(52) U.S. Cl. ............ 257/79; 257/88; 257/E33.033; 257/91
(58) Field of Classification Search ............ 257/79–103
See application file for complete search history.

(56) References Cited

U.S. PATENT DOCUMENTS

| | | | |
|---|---|---|---|
| 5,652,434 A * | 7/1997 | Nakamura et al. ............ 257/13 |
| 6,307,218 B1 | 10/2001 | Steigerwald et al. | |
| 6,614,056 B1 * | 9/2003 | Tarsa et al. ............ 257/91 |
| 7,154,124 B2 * | 12/2006 | Han et al. ............ 257/88 |
| 7,193,245 B2 * | 3/2007 | Zhao et al. ............ 257/91 |
| 2005/0133807 A1 * | 6/2005 | Park et al. ............ 257/99 |
| 2005/0212002 A1 * | 9/2005 | Sanga et al. ............ 257/96 |

FOREIGN PATENT DOCUMENTS

CN     1630110 A     6/2005

OTHER PUBLICATIONS

Chinese Office Action issued in Patent Application No. 200710004902.2 dated on Jul. 18, 2008.

* cited by examiner

*Primary Examiner*—N Drew Richards
*Assistant Examiner*—Mamadou Diallo
(74) *Attorney, Agent, or Firm*—McDermott Will & Emery LLP

(57) ABSTRACT

A nitride-based semiconductor LED comprises a substrate; an n-type nitride semiconductor layer formed on the substrate; an active layer formed on a predetermined region of the n-type nitride semiconductor layer; a p-type nitride semiconductor layer formed on the active layer; a transparent electrode formed on the p-type nitride semiconductor layer; a p-type electrode pad formed on the transparent electrode; a pair of p-type connection electrodes formed in a line extending from the p-type electrode pad so as to have an inclination angle of less than 90 degrees with respect to one side of the transparent electrode adjacent to the p-type electrode pad; a pair of p-electrodes extending from both ends of the p-type connection electrodes in the direction of the n-type electrode pad, the p-electrode being formed in parallel to one side of the adjacent transparent electrode; and an n-type electrode pad formed on the n-type nitride semiconductor layer, on which the active layer is not formed, such that the n-type electrode pad faces the p-type electrode pad.

11 Claims, 6 Drawing Sheets

[FIG. 1] -- *PRIOR ART* --
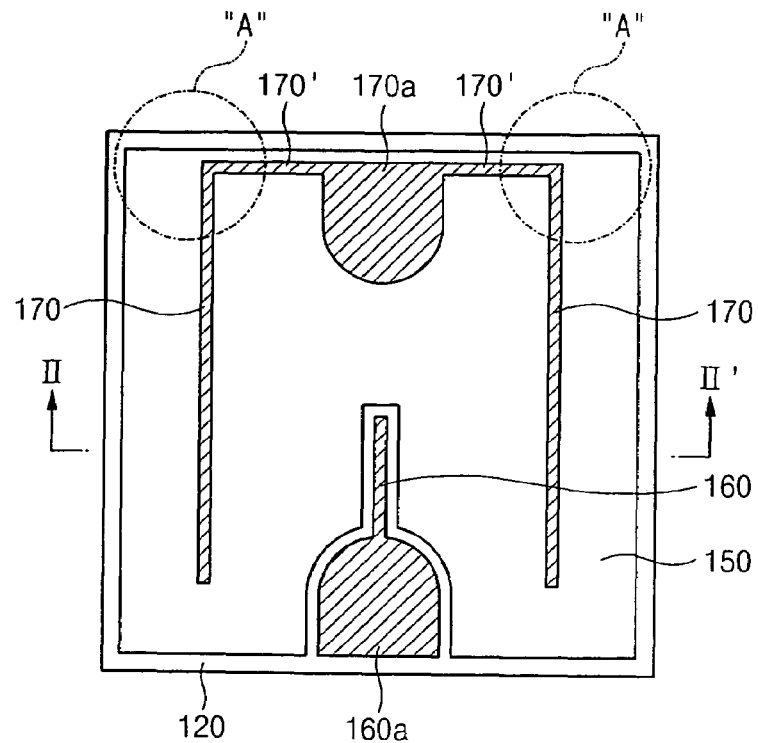
[FIG. 2] -- *PRIOR ART* --
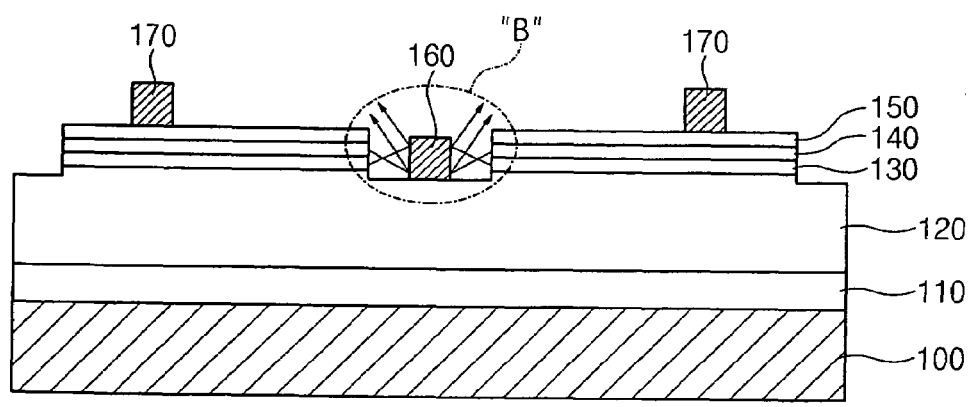

[FIG. 3]
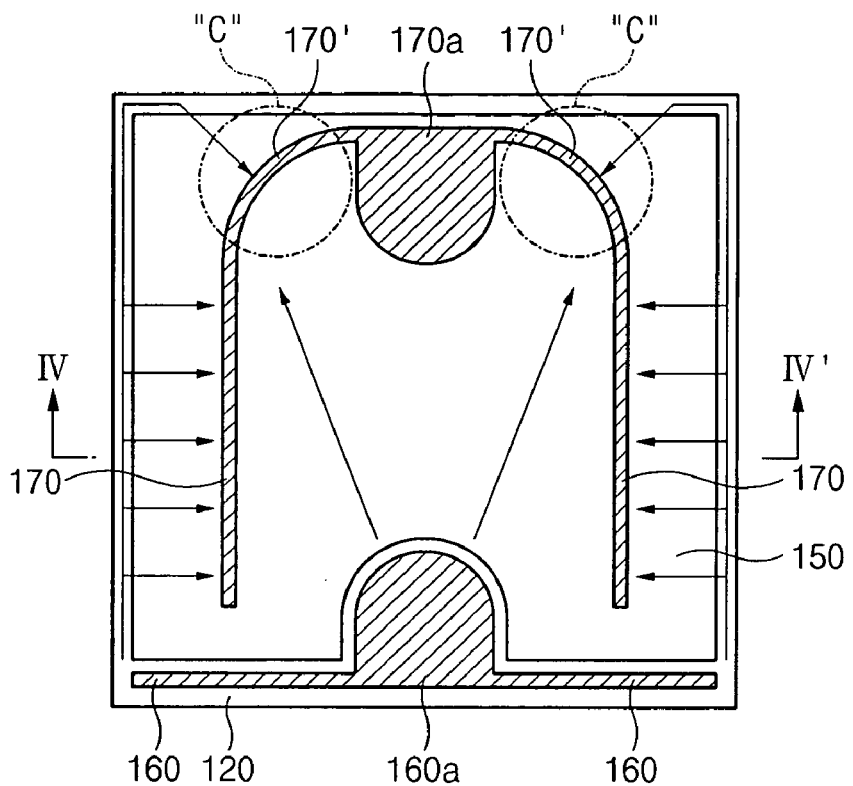
[FIG. 4]
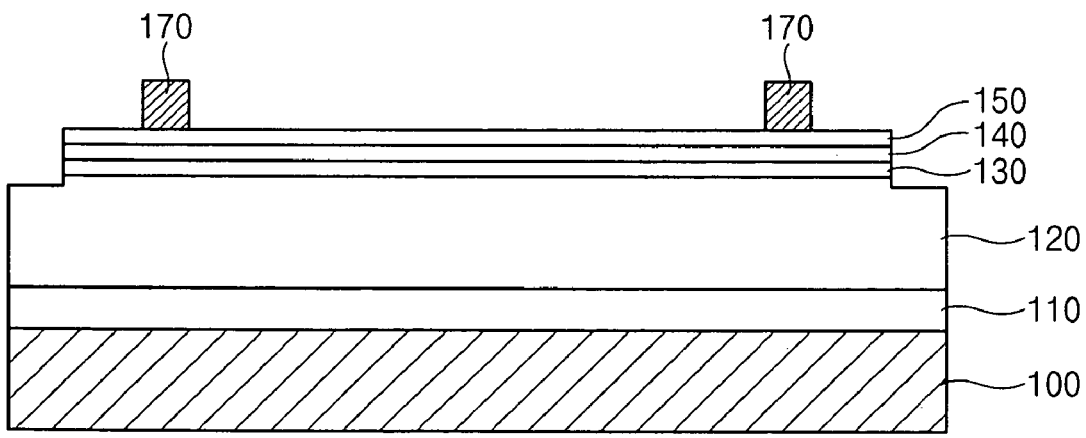

[FIG. 5]
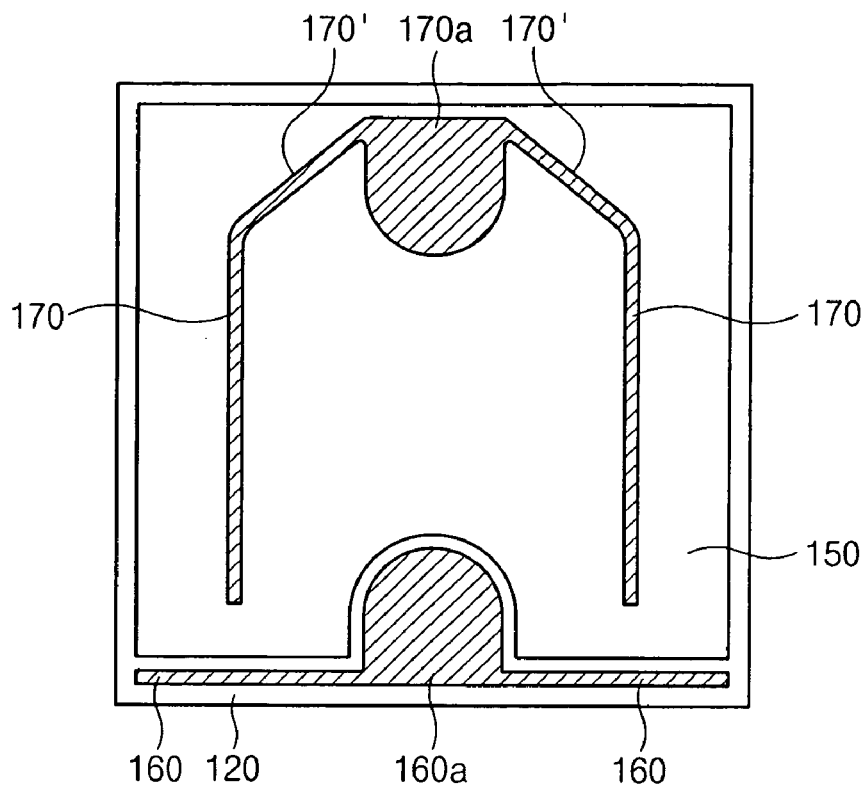
[FIG. 6]
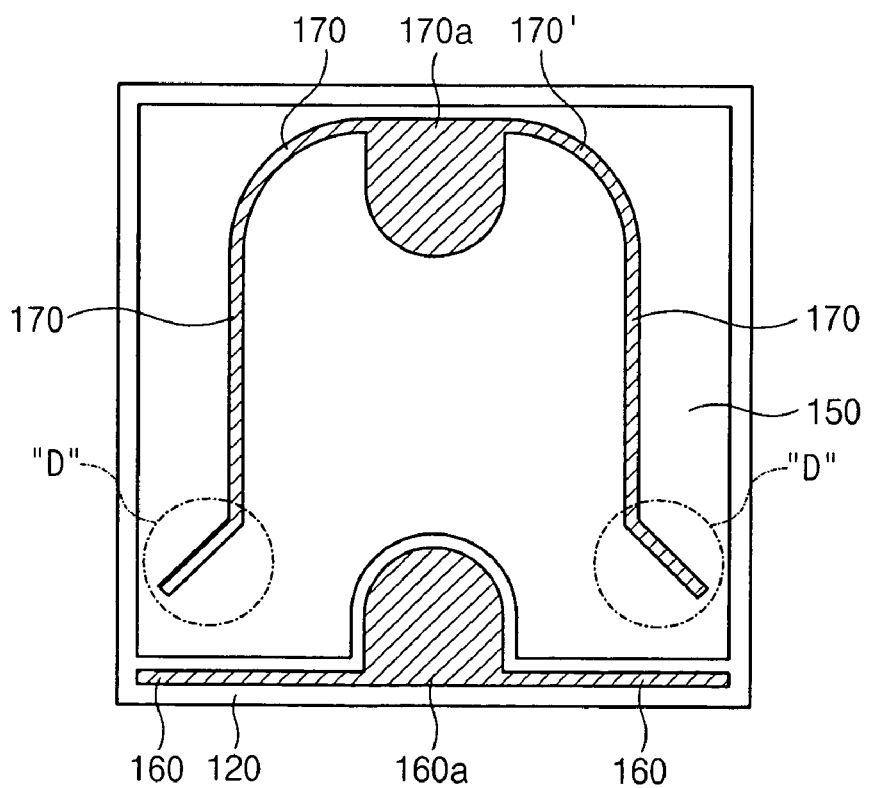

[FIG. 7]
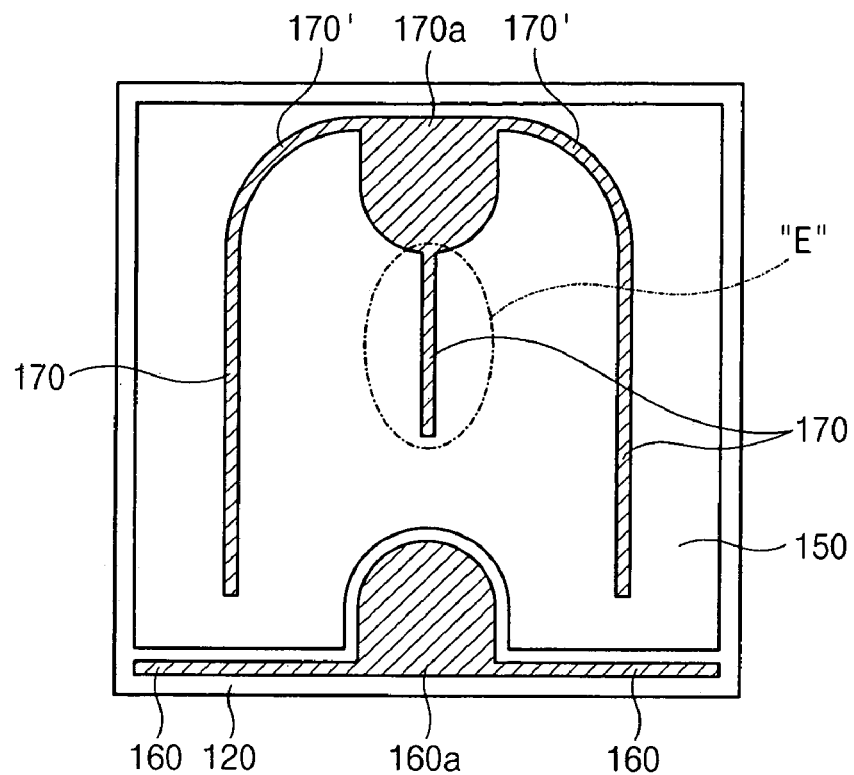
[FIG. 8]
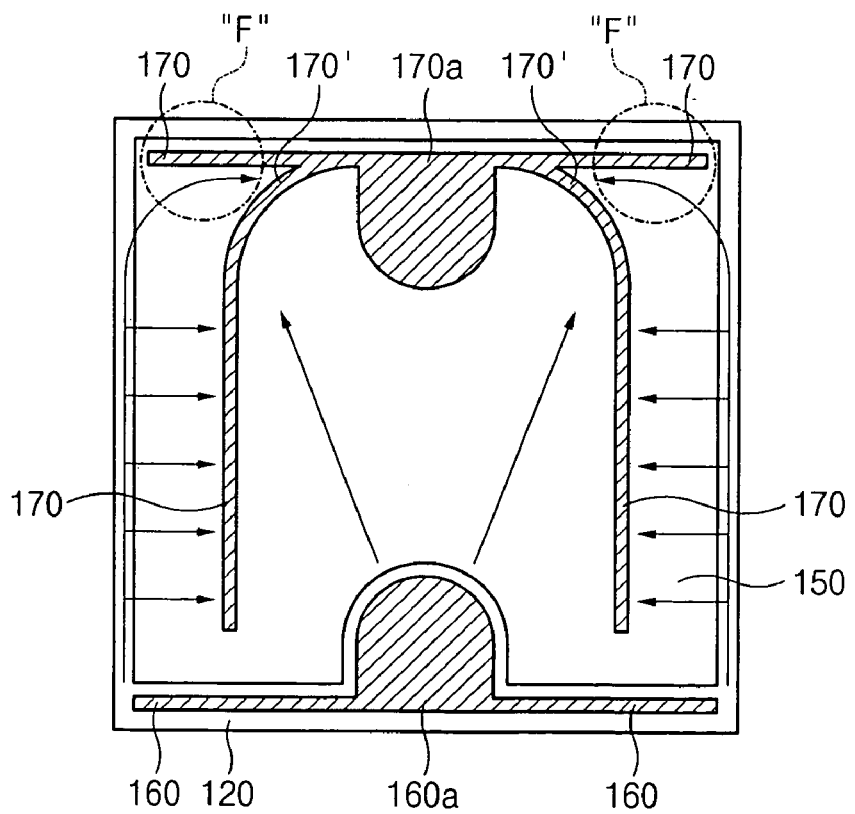

[FIG. 9]
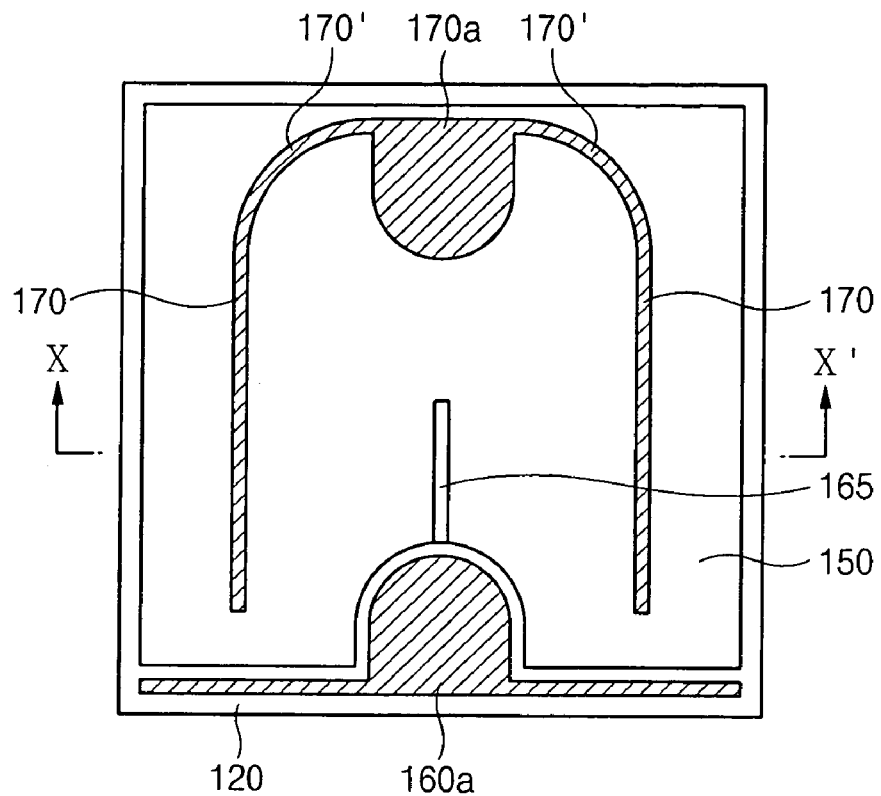
[FIG. 10]
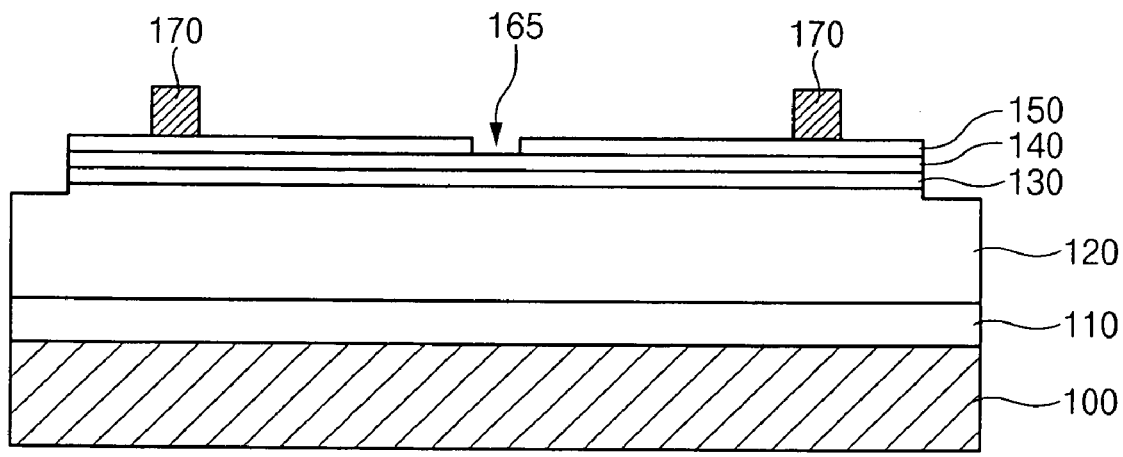

[FIG. 11]
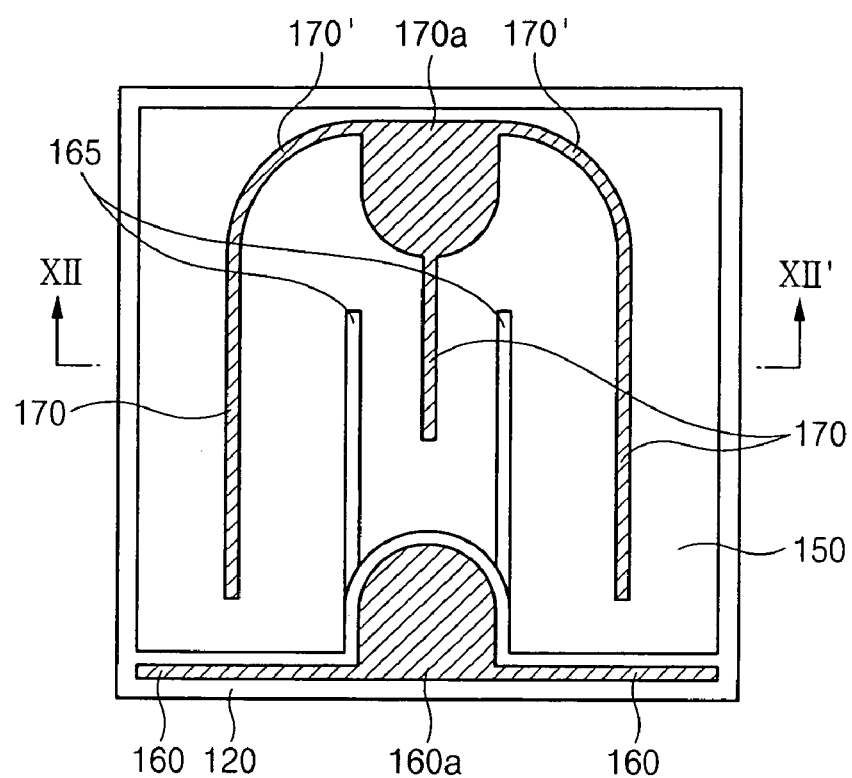
[FIG. 12]
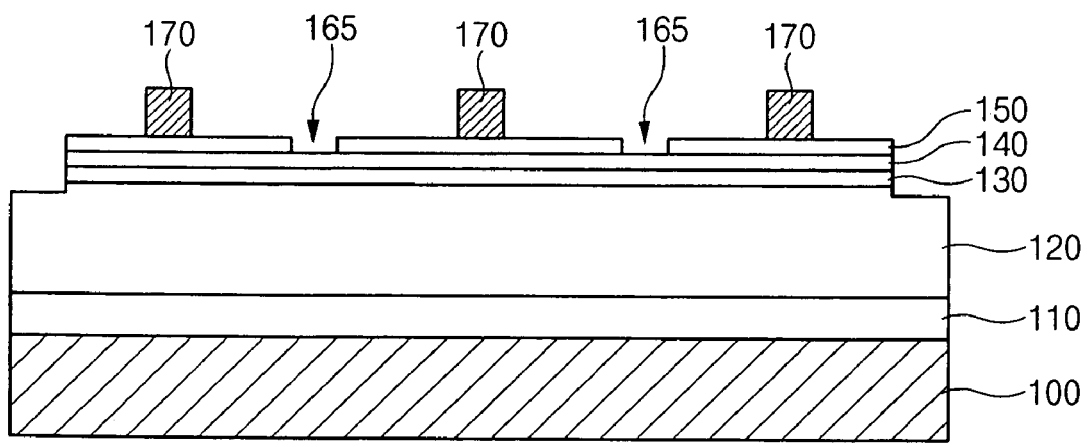

NITRIDE-BASED SEMICONDUCTOR LIGHT EMITTING DEVICE

CROSS-REFERENCE TO RELATED APPLICATIONS

This application claims the benefit of Korean Patent Application No. 2006-0030502 filed with the Korean Intellectual Property Office on Apr. 4, 2006, the disclosure of which is incorporated herein by reference.

BACKGROUND OF THE INVENTION

1. Field of the Invention

The present invention relates to a nitride-based semiconductor light emitting diode (hereinafter, referred to a nitride-based semiconductor LED) which can implement high luminance by improving the electrode structure of the nitride-based semiconductor LED.

2. Description of the Related Art

Generally, nitride-based semiconductors are group III-V semiconductor crystals having a compositional formula of $Al_xIn_yGa_{1-X-Y}N$ ($0 \leq X \leq 1$, $0 \leq Y \leq 1$, $0 \leq X+Y \leq 1$). The nitride based semiconductors are widely used as LEDs that emit short wavelength light (ranging from ultraviolet light to green light), especially blue light.

The nitride based semiconductor LEDs are manufactured by using an insulating substrate, such as a sapphire substrate or SiC substrate, which meets a lattice matching condition for crystal growth. Two electrodes connected to p-type and n-type nitride semiconductor layers, respectively, have a planar structure. In such a planar structure, the two electrodes are arranged almost horizontally on an emission structure.

The nitride based semiconductor LEDs having the planar structure must have high luminance when they are to be used as a lighting source. In order to obtain the high luminance, large-sized nitride based semiconductor LEDs are manufactured which uniformly spread a current so as to increase light-emission efficiency.

However, compared with nitride based semiconductor LEDs having a vertical structure where two electrodes are respectively arranged on the top and bottom surfaces of the emission structure, the nitride based semiconductor LEDs having the planar structure have non-uniform current flow in an entire emission region. Thus, the effective area used for light emission is not so wide that the emission efficiency is low.

Hereinafter, the problems of the large-sized nitride based semiconductor LED having the planar structure according to the related art will be described with reference to FIGS. 1 and 2.

FIG. 1 is a plan view illustrating the structure of a conventional nitride-based semiconductor LED, and FIG. 2 is a sectional view taken along II-II' line of FIG. 1.

As shown in FIGS. 1 and 2, the nitride-based semiconductor LED having a planar structure includes a buffer layer 110, an n-type nitride semiconductor layer 120, a GaN/InGaN active layer 130 having a multi-quantum well structure, and a p-type nitride semiconductor layer 140, which are sequentially formed on a sapphire substrate 100. Portions of the p-type nitride semiconductor layer 140 and the active layer 130 are removed by a mesa-etching process such that a portion of the top surface of the n-type nitride semiconductor layer 120 is exposed.

On the exposed n-type nitride semiconductor layer 120, an n-type electrode pad 160a and an n-electrode 160 extending from the n-type electrode pad 160a in one direction are formed.

On the p-type nitride semiconductor layer 140, a transparent electrode 150 composed of ITO (indium tin oxide) or the like is formed. On the transparent electrode 150, a p-type electrode pad 170a, a p-type connection electrode 170' extending from the p-type electrode pad 170a in either direction, and a p-electrode 170 extending from one end of the p-type connection electrode 170' are formed.

More specifically, the p-electrode 170 of the conventional nitride-based semiconductor LED having a planar structure is formed to have a finger structure where the n-electrode 160 is surrounded by the p-type connection electrodes 170' extending from the p-type electrode pad 170a in both directions. Therefore, in the nitride-based semiconductor LED, the p-electrode 170 and the n-electrode 160 are spaced from each other at the most uniform distance on the entire surface of the diode, thereby uniformly spreading a current flow in the overall light-emission region of the diode.

In this case, the p-electrode 170 and the p-type connection electrode 170' of the conventional nitride-based semiconductor LED are formed along the outermost side of the transparent electrode 150. Therefore, as shown in "A" portion of FIG. 1, the p-electrode 170 and the p-type connection electrode 170' form a perpendicularly-bent portion in the corner of the transparent electrode 150 where the p-electrode 170 and the p-type connection electrode 170' are joined to each other.

As described above, however, when the p-electrode 170 and the p-type connection electrode 170' form a perpendicularly-bent portion in the corner of the transparent electrode 150, a current is crowded in this bent portion, thereby reducing a characteristic and reliability of the LED.

Further, in the conventional nitride-based semiconductor LED, the n-electrode 160 extending from the n-type electrode pad 160a toward the p-type electrode pad 170a reflects some of light emitted from the active layer 130 such that a light-emitting surface corresponding to a portion where the n-etectrode 160 is positioned is diminished, as shown in "B" portion of FIG. 2. As a result, the overall luminance of the LED is reduced.

SUMMARY OF THE INVENTION

An advantage of the present invention is that it provides a nitride-based LED in which a p-type connection electrode extending from a p-type electrode pad so as to be formed along one side of a transparent electrode is formed in a line shape which has an inclination angle of less than 90 degrees with respect to one side of the transparent electrode adjacent to the p-electrode pad, thereby minimizing a current crowding effect in the corner of the transparent electrode and maximizing a light-emitting surface.

Additional aspect and advantages of the present general inventive concept will be set forth in part in the description which follows and, in part, will be obvious from the description, or may be learned by practice of the general inventive concept.

According to an aspect of the invention, a nitride-based semiconductor LED comprises a substrate; an n-type nitride semiconductor layer formed on the substrate; an active layer formed on a predetermined region of the n-type nitride semiconductor layer; a p-type nitride semiconductor layer formed on the active layer; a transparent electrode formed on the p-type nitride semiconductor layer; a p-type electrode pad formed on the transparent electrode; a pair of p-type connection electrodes formed in a line extending from the p-type electrode pad so as to have an inclination angle of less than 90 degrees with respect to one side of the transparent electrode adjacent to the p-type electrode pad; a pair of p-electrodes extending from both ends of the p-type connection electrodes in the direction of the n-type electrode pad, the p-electrode being formed in parallel to one side of the adjacent transparent electrode; and an n-type electrode pad formed on the n-type nitride semiconductor layer, on which the active layer is not formed, such that the n-type electrode pad faces the p-type electrode pad.

According to another aspect of the invention, the p-type connection electrodes formed in a linear shape are formed in a straight line or a curved line. Such a structure does not have a large effect on the characteristics and reliability of the LED.

According to a further aspect of the invention, the ends of the p-electrodes are inclined with respect to one side of the adjacent n-type electrode pad so as to face each other.

According to a still further aspect of the invention, the p-electrode pad further includes another p-electrode, which is positioned between the p-electrodes extending from the p-type connection electrodes and directly extends toward the center of the n-type electrode pad.

According to a still further aspect of the invention, the n-type electrode pad further includes a pair of n-electrodes extending in parallel to one side of the adjacent n-type nitride semiconductor layer.

According to a still further aspect of the invention, the transparent electrode further includes a line-shaped groove extending from the n-type electrode pad toward the p-type electrode pad so as to expose the top surface of the p-type nitride semiconductor layer, the transparent electrode being plane-divided by the groove. Such a structure more effectively spreads a current of an LED which needs a large size, thereby maximizing light-emission efficiency.

According to a still further aspect of the invention, the line-shaped groove exposes the top surface of the n-type nitride semiconductor layer. The groove is formed at the same time when a mesa-etching process for forming the n-type electrode pad is performed. Therefore, it is possible to simplify the process such that a production yield is enhanced.

According to a still further aspect of the invention, the line-shaped groove is formed with a finger structure where the line-shaped groove is surrounded by the p-type electrode pad and the p-electrode.

According to a still further aspect of the invention, the finger structure is symmetrically formed by reference to the n-type electrode pad and the p-type electrode pad, which are formed so as to face each other. Such a structure carries out uniform light-emission on the entire light-emission surface.

According to a still further aspect of the invention, the active layer is formed on the n-type nitride semiconductor layer such that the outermost side thereof is positioned inward at a predetermined distance from the outermost side of the n-type nitride semiconductor layer in each of four directions. In such a structure, a current flow delivered to the p-electrode from the n-type electrode pad becomes smooth through the n-type nitride semiconductor layer.

According to a still further aspect of the invention, the nitride-based semiconductor LED another pair of p-electrodes extending from the p-electrode pad so as to be formed along one side of the transparent electrode adjacent to the p-electrode pad. The p-electrodes increase a current flow in a region which becomes dark because of the p-type connection pad formed in a line having an inclination angle of less than 90 degrees with respect to one side of the transparent electrode. Then, the light-emission intensity of the region can be enhanced.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a plan view illustrating the structure of a conventional nitride-based semiconductor LED;

FIG. 2 is a sectional view taken along II-II' line of FIG. 1;

FIG. 3 is a plan view illustrating the structure of a nitride-based semiconductor LED according to a first embodiment of the invention;

FIG. 4 is a sectional view taken along IV-IV' line of FIG. 3;

FIG. 5 is a plan view illustrating the structure of a nitride-based semiconductor LED according to a first modification of a first embodiment;

FIG. 6 is a plan view illustrating the structure of a nitride-based semiconductor LED according to a second modification of the first embodiment;

FIG. 7 is a plan view illustrating the structure of a nitride-based semiconductor LED according to a third modification of the first embodiment;

FIG. 8 is a plan view illustrating the structure of a nitride-based semiconductor LED according to a fourth modification of the first embodiment;

FIG. 9 is a plan view illustrating the structure of a nitride-based semiconductor LED according to a second embodiment of the invention;

FIG. 10 is a sectional view taken along X-X' line of FIG. 9;

FIG. 11 is a plan view illustrating the structure of a nitride-based semiconductor LED according to a first modification of the second embodiment of the invention; and FIG. 12 is a sectional view taken along XII-XII' line.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, embodiments of the present invention will be described in detail with reference to the accompanying drawings.

First Embodiment

First, the structure of a nitride-based semiconductor LED according to a first embodiment of the invention will be described with reference to FIGS. 3 and 4.

FIG. 3 is a plan view illustrating the structure of the nitride-based semiconductor LED according to the first embodiment of the invention, and FIG. 4 is a sectional view taken along IV-IV' line of FIG. 3.

Referring to FIGS. 3 and 4, the nitride-based semiconductor LED according to the first embodiment forms a light emitting structure including a buffer layer 110, an n-type nitride semiconductor layer 120, an active layer 130, and a p-type nitride semiconductor layer 140, which are sequentially laminated on an optically-transparent substrate 100.

The substrate 100 is suitable for growing nitride semiconductor single crystal. Preferably, the substrate 100 is formed of a transparent material including sapphire. In addition to sapphire, the substrate 100 may be formed of zinc oxide (ZnO), gallium nitride (GaN), silicon carbide (SiC), aluminum nitride (AlN) or the like.

The buffer layer 110 is a layer for enhancing the lattice matching with the substrate 100 including sapphire before the n-type nitride semiconductor layer 120 is grown on the substrate 100. In general, the buffer layer 110 is formed of AlN/GaN.

The n-type nitride semiconductor layer 120, the active layer 130, and the p-type nitride semiconductor layer 140 can be composed of a semiconductor material having a compositional formula of $Al_X In_Y Ga_{1-X-Y}N$ ($0 \leq X \leq 1$, $0 \leq Y \leq 1$, $0 \leq X+Y \leq 1$). More specifically, the n-type nitride semiconductor layer 120 can be formed of a GaN or GaN/AlGaN layer doped with n-type conductive impurities. As for the n-type conductive impurities, Si, Ge, Sn and the like are used. Preferably, Si is mainly used. Further, the p-type nitride semiconductor layer 140 can be formed of a GaN or GaN/AlGaN layer doped with p-type conductive impurities. As for the p-type conductive impurities, Mg, Zn, Be and the like are used. Preferably, Mg is mainly used. Further, the active layer 130 can be formed of an InGaN/GaN layer having a multi-quantum well structure.

The active layer 130 can be formed to have one quantum well structure or a double-hetero structure.

Portions of the active layer 130 and the p-type nitride semiconductor layer 140 are removed by mesa-etching such that a portion of the top surface of the n-type nitride semiconductor layer 120 is exposed. Preferably, the outermost side of the active layer 140 is formed inward at a predetermined distance from the outermost side of the n-type nitride semiconductor layer 120 in each of four directions. Then, when the nitride-based LED is driven, a current flow (refer to an arrow of FIG. 3) which is applied from an n-electrode pad to be described below is uniformly spread on the entire surface of the active layer 130, that is, the entire light-emission area.

On the exposed n-type nitride semiconductor layer 120, an n-electrode pad 160a is formed. The n-electrode pad 160a is preferably formed on a region adjacent to the outermost side of the n-type nitride semiconductor layer 120, in order to minimize a loss of light-emission area.

As shown in FIG. 3, the n-electrode pad 160a according to the first embodiment of the invention may further include a linear n-electrode 160 extending in parallel to one side of the adjacent n-type nitride semiconductor layer 120 such that a current smoothly flows. In other words, when a current smoothly flows, the n-electrode 160 may be omitted depending on the characteristics and process condition of the diode.

On the p-type nitride semiconductor layer 140, a transparent electrode 150 is formed. The transparent electrode 150 is formed of conductive metallic oxide such as ITO (indium tin oxide). Further, the transparent electrode 150 may be formed of a metallic thin film having high conductivity and low contact resistance, if the metallic thin film has high transmittance with respect to a light-emission wavelength of the LED.

On the transparent electrode 150, there are formed a p-type electrode pad 170a, a pair of linear p-type connection electrodes 170' extending from the p-type electrode pad 170a in both directions, and a pair of p-electrodes 170 extending from both ends of the p-type connection electrodes 170'. The p-electrode 170 extends in the direction of the n-type electrode pad 160a in order to make a current flow smooth. Further, the p-electrode 170 is formed in parallel to one side of the adjacent transparent electrode 150.

The meaning of 'linear' in this specification does not necessarily indicate a straight line but also includes a curved line to be described below.

As shown in FIG. 3, the p-type connection electrode 170' according to the first embodiment is formed in a curved line which extends from the p-type electrode pad 170a so as to have an inclination angle of less than 90 degrees with respect to one side of the adjacent transparent electrode 150. In other words, the p-type connection electrode 170' according to the first embodiment has a bent portion (refer to 'C' of FIG. 3) formed to have a gentle inclination angle in the corner of the transparent electrode 150 having an inclination angle of 90 degrees.

The p-type connection electrode 170' according to the invention not only solves the conventional problem (refer to 'A' of FIG. 1), in which currents are crowded in the corner of the transparent electrode 150 because of a perpendicularly-bent portion, but also further enlarges an actual light-emitting surface. Therefore, it is possible to enhance light-emission efficiency.

Hereinafter, the structure of a nitride-based semiconductor LED according to first to fourth modifications of the first embodiment of the invention will be described with reference to FIGS. 5 to 8. However, the descriptions of the same components of the first to fourth modifications as the first embodiment will be omitted.

FIG. 5 is a plan view illustrating the structure of the nitride-based semiconductor LED according to the first modification of the first embodiment. As shown in FIG. 5, the p-type connection electrode 170' is formed in a straight line which extends from the p-type electrode pad 170a so as to have an inclination angle of less than 90 degrees with respect to one side of the transparent electrode 150 adjacent to the p-type electrode pad 170a. The p-type connection electrode 170' is formed to prevent currents from being crowded in the corner of the transparent electrode 150 which is formed to have an inclination angle of 90 degrees. Therefore, if the p-type connection electrode 170' has an inclination angle of less than 90 degrees with respect to the corner side of the transparent electrode 150, it is possible to obtain the same effect even through the p-type connection electrode 170' is formed in a curved line or straight line.

FIG. 6 is a plan view illustrating the structure of a nitride-based semiconductor LED according to the second modification of the first embodiment. As shown in "D" of FIG. 6, the ends of the p-type electrodes 170 extending from both ends of the p-type connection electrodes 170' in the direction of the n-type electrode pad 160a are formed to be inclined with respect to one side of the adjacent n-type electrode pad 160a such that the ends face each other. Such a structure prevents currents, applied from the n-type electrode pad 160a, from being crowded in the end of the p-type electrode 170 which is most adjacent to the n-type electrode pad 160a. Therefore, currents are more uniformly spread, thereby enhancing light-emission efficiency. The second modification can be applied to the first modification.

FIG. 7 is a plan view illustrating the structure of a nitride-based semiconductor LED according to third modification of the first embodiment. As shown in FIG. 7, the p-type electrode pad 170a is positioned between the p-electrodes 170 extending from the p-type connection electrodes 170', respectively, and further includes another p-electrode 170 directly extending toward the center of the n-type electrode pad 160a (refer to 'E' of FIG. 7). Therefore, currents spread more effectively on the entire surface of the transparent electrode 150 serving as a light-emitting surface, which makes it possible to implement a high-luminance nitride-based semiconductor LED. The third modification can be also applied to the first and second modifications.

FIG. 8 is a plan view illustrating the structure of a nitride-based semiconductor LED according to the fourth modification of the first embodiment. As shown in FIG. 8, the p-type electrode pad 170a further includes a pair of p-electrodes 170 extending from the p-type electrode pad 170a, each of the p-electrodes 170 being formed along one side of the transparent electrode 150 adjacent to the p-type electrode pad 170a (refer to 'F' of FIG. 8). The p-electrodes 170 increase a current flow in a region which becomes dark because of the p-type connection pad 170' formed in a line having an inclination angle of less than 90 degrees with respect to one side of the transparent electrode 150. Then, the light-emission intensity of the region can be enhanced. The fourth modification can be applied to the first to third modifications.

Second Embodiment

Referring to FIGS. 9 and 10, the structure of a nitride semiconductor LED according to a second embodiment of the invention will be described. However, the descriptions of the same components of the second embodiment as those of the first embodiment will be omitted.

FIG. 9 is a plan view illustrating the structure of the nitride-based semiconductor LED according to the second embodiment of the invention, and FIG. 10 is a sectional view taken along X-X' line of FIG. 9.

Referring to FIGS. 9 and 10, the nitride-based semiconductor LED according to the second embodiment has almost the same construction as the nitride-based semiconductor LED according to the first embodiment. However, the nitride-based semiconductor LED according to the second embodiment further includes a line-shaped groove 165 directed toward the p-type electrode 170a from the n-type electrode pad 160a, the line-shaped groove 165 exposing a portion of the top surface of the p-type nitride semiconductor layer 140.

In other words, the nitride-based semiconductor LED according to the second embodiment further includes the line-shaped groove 165 formed in the transparent 150, the groove 165 being surrounded by a finger structure through the p-type electrode pad 170a, the p-type connection pad 170', and the p-electrode 170. The transparent electrode 150 is plane-divided into two parts by the groove 165.

Preferably, the finger structure formed through the line-shaped groove 165 is symmetrically formed by reference to the n-type electrode pad 160a and the p-type electrode pad 170a which are formed to face each other, in order to uniformize current spreading.

In this embodiment, the depth of the line-shaped groove 165 included in the transparent electrode 150 is defined as the position where the top surface of the p-type nitride semiconductor layer 140 is exposed. Without being limited thereto, however, the depth can be defined as the position where the top surface of the n-type nitride semiconductor layer 120 is exposed while a mesa-etching process for forming the n-type electrode pad 160a is performed.

Hereinafter, the structure of a nitride-based semiconductor LED according to a first modification of the second embodiment will be described with reference to FIGS. 11 and 12. However, the descriptions of the same components of the first modification as those of the second embodiment will be omitted.

FIG. 11 is a plan view illustrating the structure of a nitride-based semiconductor LED according to the first modification of the second embodiment, and FIG. 12 is a sectional view taken along XII-XII' line of FIG. 11.

The nitride-based semiconductor LED according to the first modification of the second embodiment has almost the same construction as the nitride-based semiconductor LED according to the second embodiment. Referring to FIGS. 11 and 12, however, the transparent electrode 150 of the nitride-based semiconductor LED according to the first modification is plane-divided into three parts, not two parts, by the lined shaped grooves 165 formed in the transparent electrode 150.

The first modification can obtain the same operation and effect as the second embodiment. Further, since the transparent electrode 150 is plane-divided into three parts by the line-shaped grooves 165, it is possible to provide a large-area nitride-based semiconductor LED which can operate in a large current. The second embodiment can be applied to the first to fourth modifications of the first embodiment.

As described above, the p-type connection electrode, which extends from the p-type electrode pad so as to be formed along one side of the transparent electrode, is formed in a line having an inclination angle of less than 90 degrees with respect to one side of the transparent electrode adjacent to the p-type electrode pad, thereby minimizing current crowding in the corner of the transparent electrode.

Further, it is possible to further enlarge an actual light-emitting surface through the p-type connection electrode formed in a line having an inclination angle of less than 90 degrees in the corner of the transparent electrode.

Therefore, it is possible to minimize current crowding in the nitride-semiconductor LED and to enhance luminance characteristics, thereby improving characteristics and reliability of the diode.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A nitride-based semiconductor LED comprising:
   a substrate;
   an n-type nitride semiconductor layer formed on the substrate;
   an active layer formed on a predetermined region of the n-type nitride semiconductor layer;
   a p-type nitride semiconductor layer formed on the active layer;
   a transparent electrode formed on the p-type nitride semiconductor layer;
   a p-type electrode pad formed on the transparent electrode;
   a pair of p-type connection electrodes formed in a line extending from the p-type electrode pad so as to have an inclination angle of less than 90 degrees with respect to one side of the transparent electrode adjacent to the p-type electrode pad;
   a pair of p-electrodes extending from both ends of the p-type connection electrodes in the direction of the n-type electrode pad, the p-electrode being formed in parallel to one side of the adjacent transparent electrode; and
   an n-type electrode pad formed on the n-type nitride semiconductor layer, on which the active layer is not formed, such that the n-type electrode pad faces the p-type electrode pad, wherein the n-type electrode pad further includes a pair of n-electrodes extending in parallel to one side of the adjacent n-type nitride semiconductor layer, wherein the transparent electrode further includes a line-shaped groove extending from the n-type electrode pad toward the p-type electrode pad so as to expose the top surface of the p-type nitride semiconductor layer, the transparent electrode being plane-divided by the line-shaped groove.

2. The nitride-based semiconductor LED according to claim 1, wherein the p-type connection electrodes formed in a linear shape are formed in a straight line or a curved line.

3. The nitride-based semiconductor LED according to claim 1, wherein the ends of the p-electrodes are inclined with respect to one side of the adjacent n-type electrode pad so as to face each other.

4. The nitride-based semiconductor LED according to claim 1, wherein the p-electrode pad further includes another p-electrode, which is positioned between the p-electrodes extending from the p-type connection electrodes and directly extends toward the center of the n-type electrode pad.

5. The nitride-based semiconductor LED according to claim 1, wherein the line-shaped groove is formed with a finger structure where the line-shaped groove is surrounded by the p-type electrode pad and the p-electrode.

6. The nitride-based semiconductor LED according to claim 5, wherein the finger structure is symmetrically formed by reference to the n-type electrode pad and the p-type electrode pad, which are formed so as to face each other.

7. The nitride-based semiconductor LED according to claim 1, wherein the line-shaped groove exposes the top surface of the n-type nitride semiconductor layer.

8. The nitride-based semiconductor LED according to claim 1, wherein the active layer is formed on the n-type nitride semiconductor layer such that the outermost side thereof is positioned inward at a predetermined distance from the outermost side of the n-type nitride semiconductor layer in each of four directions.

9. The nitride-based semiconductor LED according to claim 1 further comprising
another pair of p-electrodes extending from the p-electrode pad so as to be formed along one side of the transparent electrode adjacent to the p-electrode pad.

10. The nitride-based semiconductor LED according to claim 1 further comprising
a buffer layer formed in the interface between the substrate and the n-type nitride semiconductor layer.

11. The nitride-based semiconductor LED according to claim 1, wherein the pair of n-electrodes are formed at a side portion of the n-type semiconductor layer.

* * * * *